United States Patent
Tsironis

(10) Patent No.: US 11,733,280 B1
(45) Date of Patent: Aug. 22, 2023

(54) LOAD PULL SYSTEM USING TWO-PROBE WAVEGUIDE TUNER

(71) Applicant: Christos Tsironis, Kirkland (CA)

(72) Inventor: Christos Tsironis, Kirkland (CA)

(*) Notice: Subject to any disclaimer, the term of this patent is extended or adjusted under 35 U.S.C. 154(b) by 0 days.

(21) Appl. No.: 17/514,726

(22) Filed: Oct. 29, 2021

(51) Int. Cl.
  *G01R 27/32* (2006.01)
  *G01R 31/28* (2006.01)
  *G01R 35/00* (2006.01)
  *H01P 5/04* (2006.01)

(52) U.S. Cl.
  CPC ......... *G01R 27/32* (2013.01); *G01R 31/2822* (2013.01); *G01R 35/005* (2013.01); *H01P 5/04* (2013.01)

(58) Field of Classification Search
  CPC .. G01R 27/32; G01R 31/2822; G01R 35/005; H01P 5/04
  See application file for complete search history.

(56) References Cited

U.S. PATENT DOCUMENTS

| | | | |
|---|---|---|---|
| 5,910,754 A | 6/1999 | Simpson et al. | |
| 6,674,293 B1 | 1/2004 | Tsironis | |
| 8,416,030 B2 * | 4/2013 | Simpson | H01P 1/127 333/263 |
| 9,625,556 B1 * | 4/2017 | Tsironis | G01R 27/32 |
| 9,712,134 B2 * | 7/2017 | Dudkiewicz | H01P 5/04 |
| 9,716,303 B1 * | 7/2017 | Tsironis | H01P 5/04 |
| 2011/0115582 A1 * | 5/2011 | Simpson | H01P 1/15 333/263 |

OTHER PUBLICATIONS

"Load Pull Measurements" [online], Wikipedia [retrieved on Nov. 18, 2016] Retrieved from Internet <URL:http://en.wikipedia.org/wiki/Load_pull>.
W Band Programmable Tuner Model 11075, Product Note 43, 1997, Focus Microwaves.
"Signal-flow graph" [online], Wikipedia [retrieved on Aug. 31, 2021]. Retrieved from Internet <URL: https://en.wikipedia.org/wiki/Signal-flow_graph>.
"Linear Actuator" [online], Wikipedia [retrieved on Apr. 25, 2020]. Retrieved from Internet <URL: https://en.wikipedia.org/wiki/Linear_actuator>.

* cited by examiner

*Primary Examiner* — Giovanni Astacio-Oquendo
*Assistant Examiner* — Dilara Sultana

(57) ABSTRACT

A new load-pull tuner system using two-probe waveguide slide screw tuners of which the probes share the same waveguide section; they are inserted diametrically at fixed depth facing each other into slots on opposite broad walls of the waveguide. An adjustable broadband attenuator made using a resistive septum is inserted between the test port and the tuning probes. The tuner does not have cumbersome adjustable vertical axes controlling the penetration of the probes and its low profile is optimized for on-wafer operations. The carriages holding the probes are moved along the waveguide using electric stepper motors or linear actuators.

6 Claims, 15 Drawing Sheets

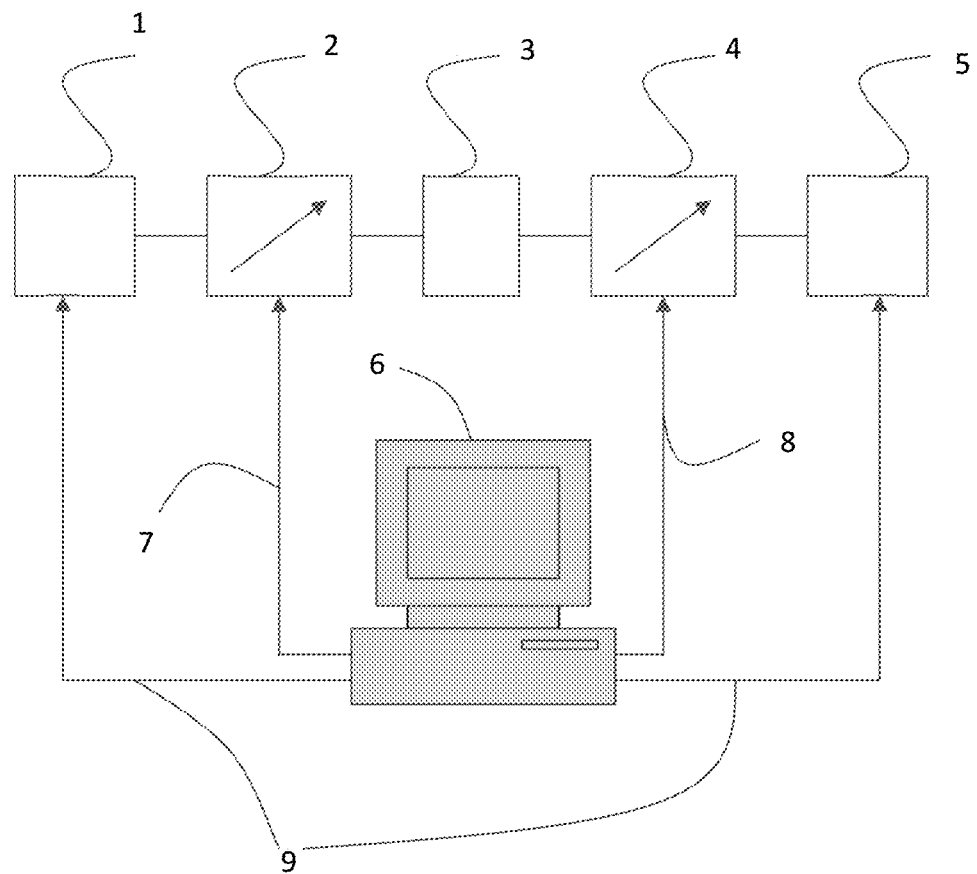
FIG. 1: Prior art

FIG. 2A: Prior art
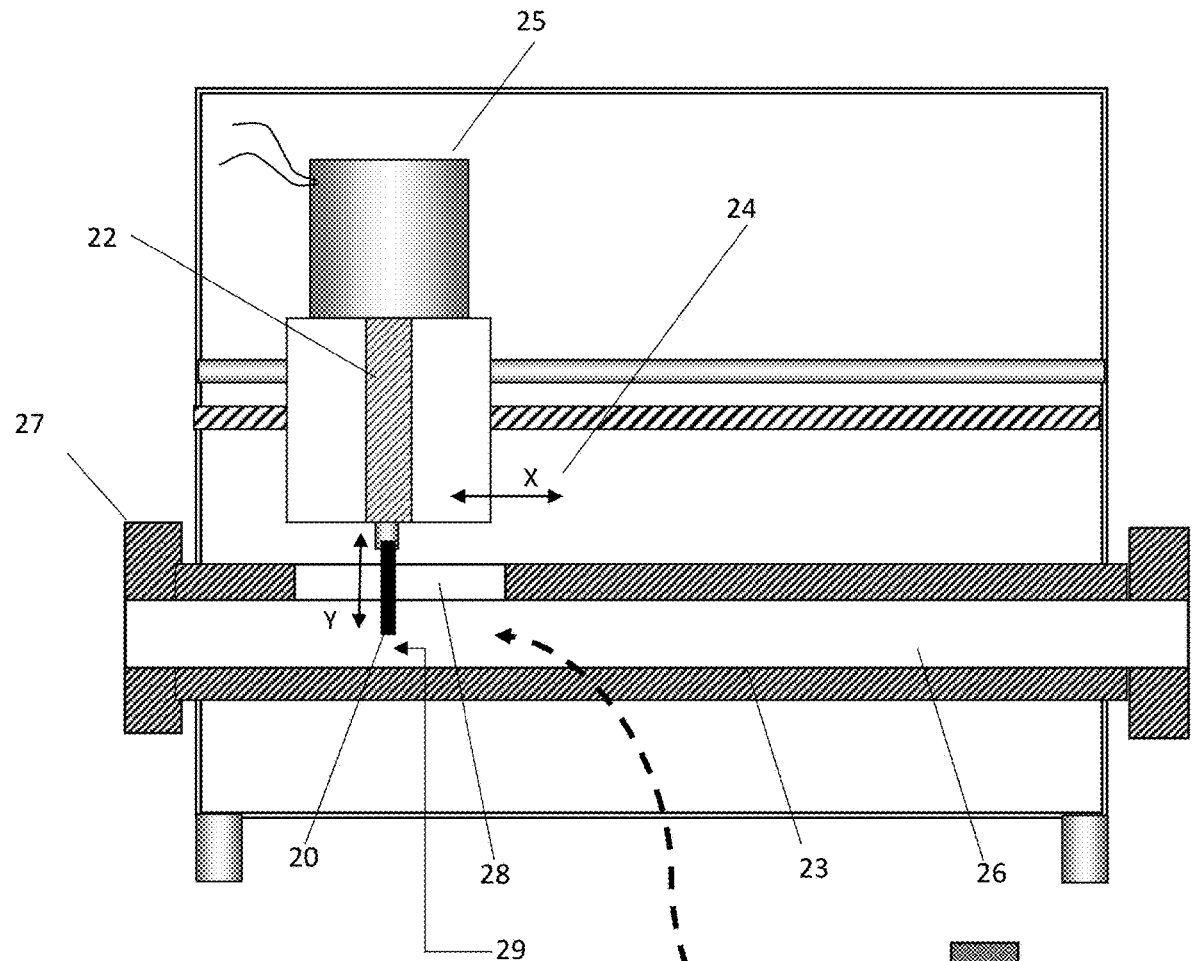
FIG. 2B: Prior art
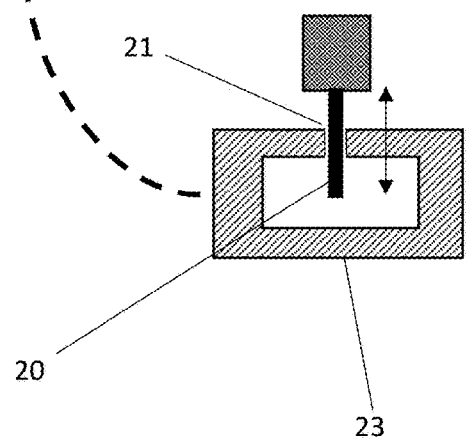

FIG. 13A: Prior art
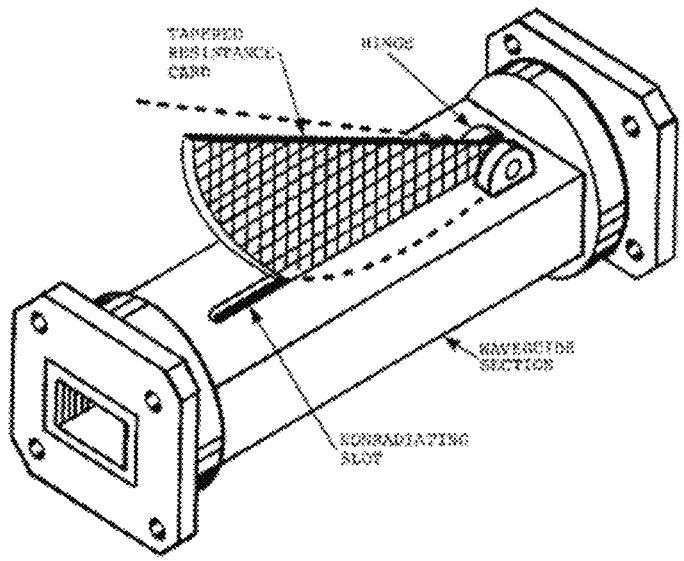
FIG. 13B: Prior art
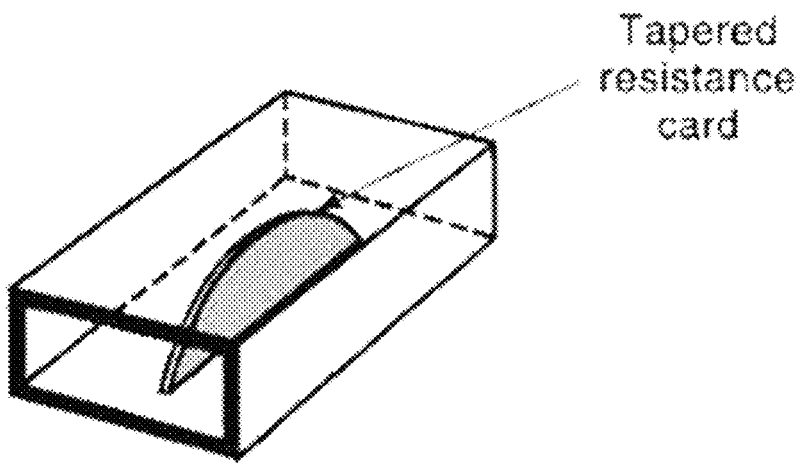

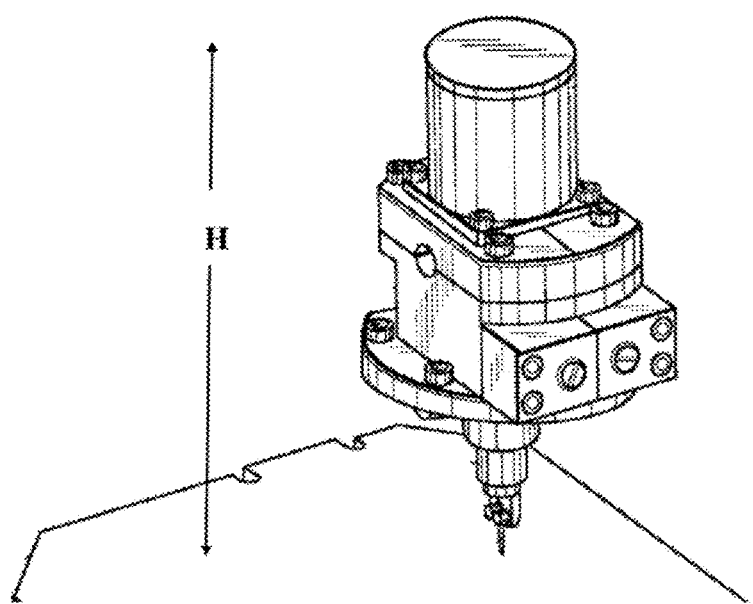
FIG. 14: Prior art

LOAD PULL SYSTEM USING TWO-PROBE WAVEGUIDE TUNER

CROSS-REFERENCE TO RELATED ARTICLES

1. "Load Pull Measurements" [online], Wikipedia [retrieved on Nov. 18, 2016] Retrieved from Internet < URL: en.wikipedia.org/wiki/Load_ pull.>
2. W Band Programmable Tuner Model 11075, Product Note 43, Focus Microwaves August 1977.
3. Simpson et al., U.S. Pat. No. 5,910,754, "Reduced height waveguide tuner for impedance matching", FIG. 8.
4. Tsironis C., U.S. Pat. No. 6,674,293, "Adaptable Pre-Matched Tuner System and Method".
5. Tsironis C., U.S. Pat. No. 9,625,556, "Method for Calibration and Tuning with Impedance Tuners".
6. "Signal-flow graph" [online], Wikipedia [retrieved on Aug. 31, 2021]. Retrieved from Internet <URL: en.wikipedia.org/wiki/Signal-flow_graph.>
7. "Linear Actuator" [online], Wikipedia [retrieved on Apr. 25, 2020 ] Retrieved from Internet <URL: en.wikipedia.org/wiki/Linear_actuator>.

BACKGROUND OF THE INVENTION

This invention relates to load and source pull testing of RF and millimeter-wave transistors and amplifiers using remotely controlled electro-mechanical waveguide impedance tuners.

A popular method for testing and characterizing RF and millimeter-wave transistors in their non-linear region of operation is "load pull" (see ref. 1). Load pull is a device measurement technique employing microwave and millimeter-wave impedance (load-pull) tuners and other test equipment as shown in FIG. 1. The waveguide tuners 2, 4 (see ref. 2) are used in order to manipulate the microwave impedance conditions under which the Device Under Test (DUT, or transistor, 3) is tested; the test signal is provided by a signal source 1 and the out-coming power is measured by a power meter 5; the whole is controlled by a PC controller 6, which includes an electronic interface to communicate with the instruments 1, 5 and the tuners 2, 4 using digital control and communication cables 7, 8 and 9.

DESCRIPTION OF PRIOR ART

Waveguide impedance tuners include, in general, a low-loss transmission line 26, FIG. 2, and a conductive tuning element (tuning probe, 20) inserted in a slot 28 machined into the waveguide 23; the probe 20 is a conductive rod and is attached to a complex, adjustable high precision motor-controlled 25 vertical axis 22 and is inserted contactless 21 into the slot 28 and moved 24 along the axis of the waveguide; this movement of the tuning probe creates, in a certain frequency range, a controllable variable reactance which, combined with a following matched load allow the synthesis of various impedances (or reflection factors) which are present at the test port 27 covering up to the quasi totality of the Smith chart (the polar impedance mapping display shown as normalized reflection factor, FIG. 3). The impedance synthesis generated by the movement of the tuning probe follows a path 30, 31 between the matched load at the origin (50Ω) and an arbitrary target-1. Inserting the tuning probe into the slot creates path 30 and moving it along the slot creates path 31. The relation between reflection factor Γ and impedance Z is given by Γ=(Z−Zo)/(Z+Zo), wherein Z=R+jX and wherein Zo is the characteristic impedance. A typical value used for Zo is 50Ω.

When conductive tuning probes (typically, but not exclusively, metallic or metallized rods) 20, FIG. 2, penetrate into the waveguide cavity 26, they capture and deform the electric field, which is concentrated in the area 29 between the bottom tip of the probe 20 and the ground plane 23 of the waveguide. This field deformation allows creating the high and controllable reflection factors. The main disadvantage of this embodiment is the requirement for high precision and resolution and, by consequence, tall and cumbersome vertical probe movement mechanisms 22 (FIG. 14, see ref. 3) precise over their entire travel range and able to fully insert or extract the tuning probe from the waveguide cavity, since the significant portion of reflection occurs when the probe tip is very close to the inner wall of the waveguide (ground plane). This movement process slows down the tuning procedure for two reasons: (a) when the probe is withdrawn, the vertical movement is lengthy and much less effective in terms of generating useful reflection factor, and (b), because the vertical moving resolution is constant, enhanced positioning accuracy and resolution are required all the way due to high tuning sensitivity in the high reflection area, when the probe is deeply inserted and close to the ground plane.

Related prior art (see ref. 4), both with coaxial or waveguide transmission lines, does not teach impedance tuners with fixed penetration (or vertical position) dual tuning probes; prior art tuners require at least one high precision complex vertical axis (FIG. 14) to be able to create path 30 in FIG. 3 and tune. Neither relevant prior art ref. 2 or 4 teach a compact tuner using alternatively swapping and crossing over tuning probes in a shared transmission line arrangement. This overlapping structure, though, is essential and compatible with the proposed low profile, compact size tuner and attractive, because of the new high speed adaptive tuner operation (see ref. 4).

BRIEF SUMMARY OF THE INVENTION

The invention discloses a new type waveguide load pull slide screw tuner system. The tuner configuration and the associated calibration and tuning algorithms are different from prior art; the tuner uses horizontal-only high-speed movement techniques of two crossing over tuning probes (conductive rods) penetrating in slots of the waveguide and an integrated damping attenuator allowing the control of the wideband reflection factor.

In order to allow the tuning rods to cross over without mechanical conflict, the slots are slightly offset from the center line of the waveguide, by at least one diameter (thickness) of a tuning rod. A medium size reflection (S11≈0.5–0.7) is created by either tuning rod leading to a new tuning mechanism as shown in FIG. 3 (traces 32, 33). The tuning mechanisms following prior art path 30-31 and new paths 32-33 and 34-35 shown in FIG. 3, all yield the same result: starting from the matched load (50Ω) they allow tuning to targets 1 to 3. The result is the same, only the control mechanisms differ. However new path 32-33 can tune to 50Ω only at a concrete frequency, there is always a high reflection at another frequency range, which may cause spurious oscillations of the DUT; however, inserting the resistive tapered septum 55, limits the maximum reflection at all frequencies (path 34-35).

The probe holding carriages 45 are controlled using high-speed electric stepper motors 54 and ACME rods 51 or actuators (see ref. 7), thus eliminating this way additional control gear. Last, not least, the tuning mechanism, liberated from cumbersome and expensive high resolution vertical probe control and movement delays, benefits also from inherent lower tuning error sensitivity to mechanical probe positioning tolerances close to $|\Gamma|\approx1$.

BRIEF DESCRIPTION OF THE SEVERAL VIEWS OF THE DRAWINGS

The invention and its mode of operation will be better understood from the following detailed description when read with the appended drawings, in which:

FIG. 1 depicts prior art: a typical generic automated load pull test system.

FIGS. 2A through 2B depict prior art: a single probe waveguide impedance tuner; FIG. 2A depicts a front view of the entire tuner; FIG. 2B depicts a cross section of the tuning probe (typically a conductive rod) entering the waveguide slot.

FIG. 6A depicts the equivalent circuit of the septum attenuator; FIG. 6B depicts the overall signal flow graph; FIG. 6C identifies the signal transmission flow and nodes of the tuner depicted in the signal flow graph and FIG. 6D depicts the reflection area of a tuning probe.

FIGS. 13A through 13B depict prior art: embodiments of resistive attenuation cords or septum.

FIG. 14 depicts prior art: a cumbersome vertical axis used in a waveguide tuner (see ref. 3).

DETAILED DESCRIPTION OF THE INVENTION

Figure 3:
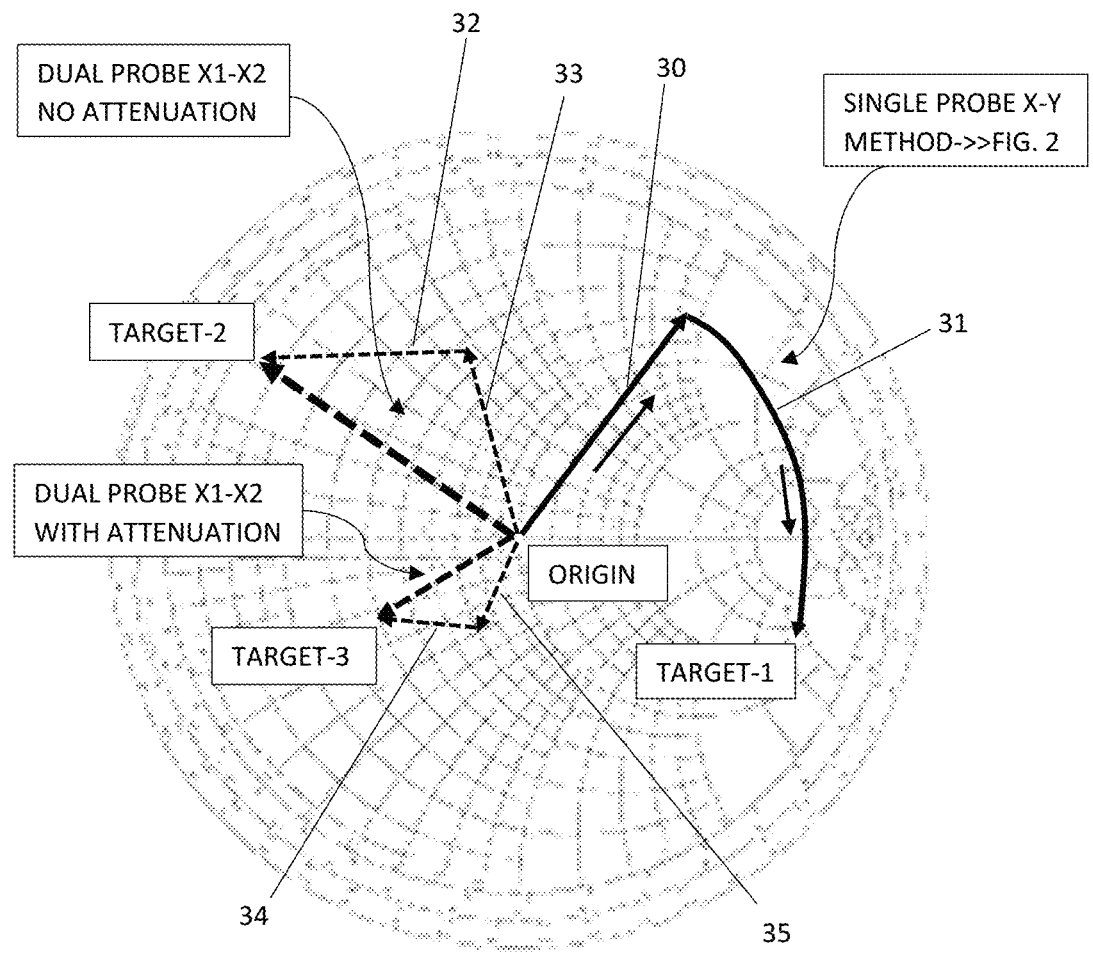
FIG. 3 depicts partly prior art: a Smith chart and three possible trajectories of impedance synthesis (tuning) to reach target impedances, starting from the origin of 50Ω. Reaching target-1 uses the prior art single-probe technique with horizontal and vertical tuning probe control; reaching targets 2 and 3 uses the new two-probe technique with horizontal only and without vertical control. Target-2 is reached without septum attenuation, target-3 with moderate septum attenuation (see also FIG. 14).

This invention discloses a high frequency (RF, microwave, millimeter wave), computer-controlled impedance tuning system, suitable for load pull measurements, which includes at least one electro-mechanical waveguide impedance tuner, the calibration method of the tuner and an impedance synthesis (tuning) method. The tuner (FIGS. 4 and 5) uses a low loss waveguide transmission airline 40, which includes two broad top walls, two narrow sidewalls and three slots: two slots 46 and 47 and one slot 56 cut into the broad walls: two slots (47 and 56) are cut on the top and one slot 46 is cut on the bottom wall. All slots run parallel 43 to the waveguide longitudinal axis and the slots 46 and 47 are positioned opposite to each other and slightly offset from the symmetrical center line of the waveguide. The offset dimension is selected to allow two tuning probes (typically metallic or metallized rods 42) to cross over without touching. This structure is chosen for economy of space, because it uses slots of a total length of one half of a wavelength plus the thickness of one tuning rod, so there is a λ/2 free travel possible in order to cover 360° reflection factor angle. An alternative configuration, where the tuning rods would not cross over, would, in principle, also work, but the slot (and the tuner) would have to be twice as long. The horizontal control of the carriages 45 can be accomplished using stepper motors 54 and ACME 51 screws as well as linear electric actuators (see ref. 6). The actuators have a motorized body, and their rotor axis is the extended horizontal ACME screw 51.

The tuner also includes a tapered resistive septum 55, insertable into the third slot between the test port 50 and the tuning probes 42; the septum is inserted in the third slot on one of the broad waveguide walls and serves in damping the signal flow (FIG. 13A and 13B). The tuner having two non-withdrawable tuning probes can only tune to 50Ω at one frequency; everywhere else the residual reflection can be high, in which case the DUT may oscillate triggered either by the stimulus signal or spontaneously at random, in particular at low frequencies where the DUT gain is typically high, and render the measurement meaningless; to avoid such a situation the resistive septum, in reality an adjustable wideband low reflection attenuator, is inserted and limits the range of reflection (FIG. 9); the setting of the septum is selected to a few values SPT (penetrations) and is part of the tuner calibration and is used accordingly. If the DUT is absolute stable the septum is fully withdrawn (SPT=0) and the attenuation is negligible.

Figure 4:
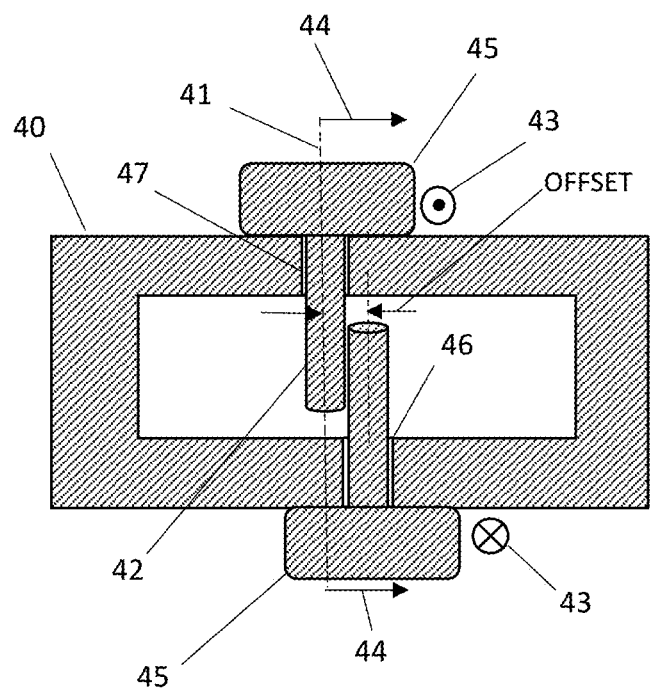
FIG. 4 depicts a cross-section through a waveguide transmission line with two conductive tuning rods (probes) entering from opposite sides into slightly offset slots.
Figure 5:
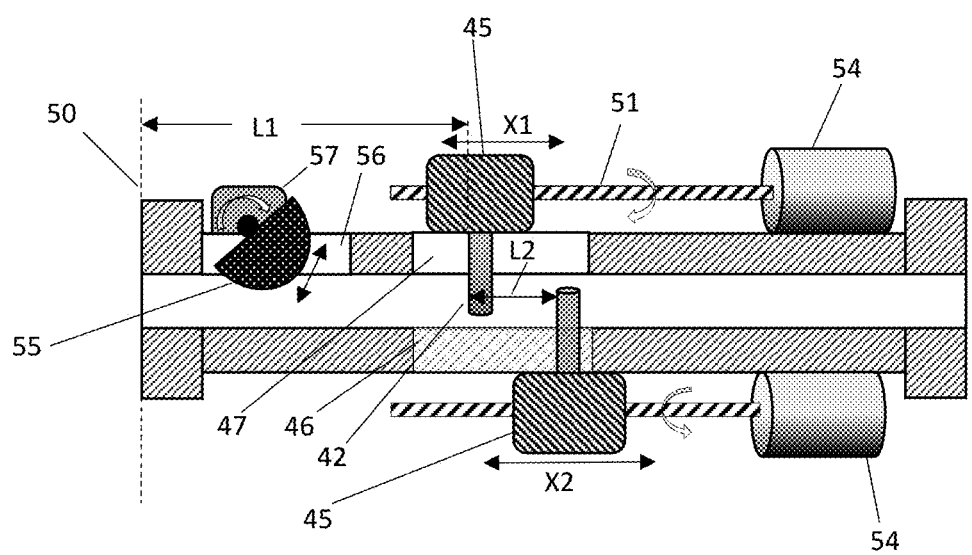
FIG. 5 depicts a front view of the waveguide tuner with two crossing over tuning probes and a resistive tapered attenuation septum.

FIG. 5 shows a front view of the waveguide tuner also shown as a cross section 41, 44 of FIG. 4: the opposite slots 46 and 47 can be seen to be half a wavelength long and 56 being as long as the resistive tapered septum 55 requires, which is inserted into the cavity 26 of the waveguide rotated by remotely controlled motor 57; the mobile carriages 45 are controlled by the ACME screw 51 along the waveguide via the stepper motors 54; the reference position of one carriage/probe is X1 and of the other is X2, both relative to an arbitrary, but common, zero position. The electric distance of the first tuning rod 42 from the test port 50 is L1 and the electric distance between the two tuning rods is L2; the lower slot 46 is partially hidden in FIG. 5 as it is evident from the cross section 44 in FIG. 4.

Figure 7:
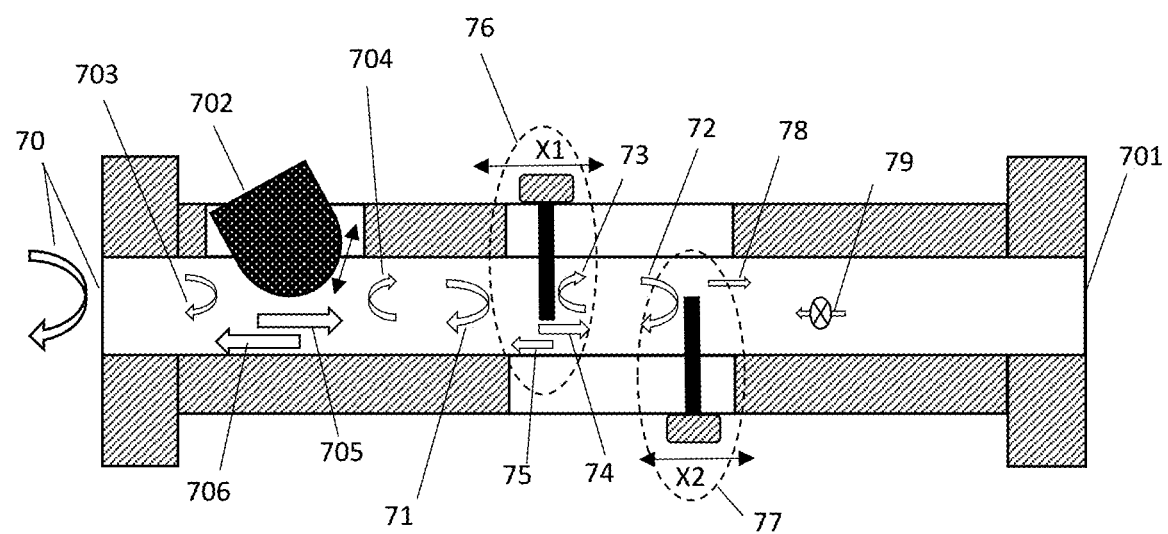
FIG. 7 depicts signal flow and multiple reflections created by the two probes and the resistive tapered septum of a two-probe impedance tuner with shared waveguide. The probes can swap positions with regard to the test port 70.

The signal propagation paths are shown in FIG. 7: the total controlled reflection factor S11(X1,X2) 70 is a dynamic function of the combined positions X1 and X2 of the two probes 76 and 77 and the static setting of the resistive septum 702; the dynamic reflection is the vector-sum of the static vector 703 and the dynamic reflection factors 71 and 72 of both probes S11(X1)+S11(X2): S11(X1,X2)=S11(X1)+S11(X2), all referenced at the test port 70. The resistive septum 702 adds the small static reflection 703, but its main function is wideband signal attenuation, in order to reduce the risk of spontaneous spurious oscillations of the DUT. The signal 705 passing through the attenuator 702 reaches the tuning probe 76 closest to the test port generates the primary reflection 71; this returning signal is split by the attenuator 702 into a traversing portion 706 and a reflected portion 704. Since this reflection is selected not to be total, there is a signal portion 74 traversing towards the secondary probe 77; this signal portion is then reflected back 72 towards the primary probe; again, a portion 75 of this reflected back signal traverses the primary probe 76 towards the test port and adds to the total reflection 70. The signal 72 reflected at the secondary probe is also reflected back 73 at the primary probe, and so on, creating the phenomenon of a multiple reflection. In mechanical (aero-dynamics, hydraulics) terms this appears like a turbulence. This back and forth bouncing of signal is described using signal flow graphs (see ref. 5). Instead, since the tuner is terminated with a matched load any escaping signal 78 is not reflected back 79 and is therefore ignored. A similar phenomenon occurs between the resistive tapered septum 702 and probe 76, creating an additional set of multiple reflections 704-71.

Figure 6A:
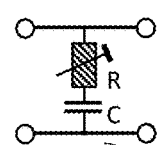
FIGS. 6A through 6D depict the signal flow graph (SFG, see ref. 6) of the two-probe impedance tuner with resistive tapered septum attenuator.
Figure 6D:
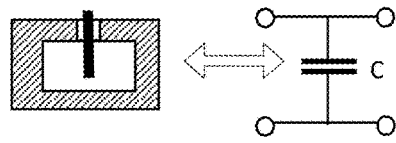
Figure 6B:
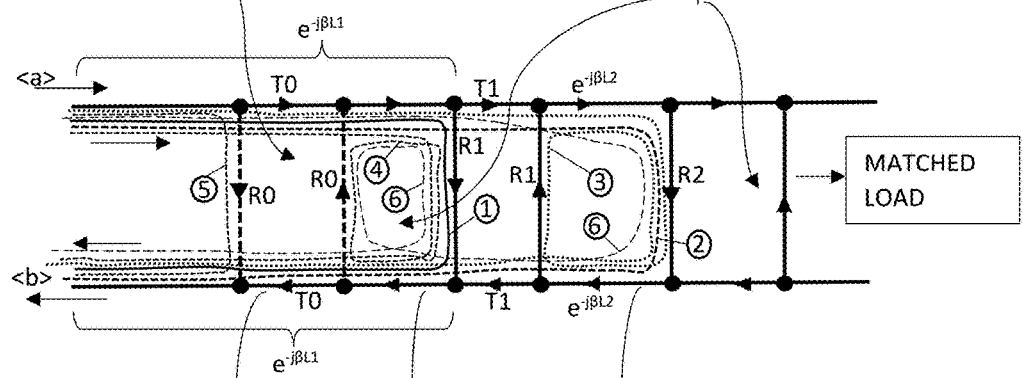
Figure 6C:
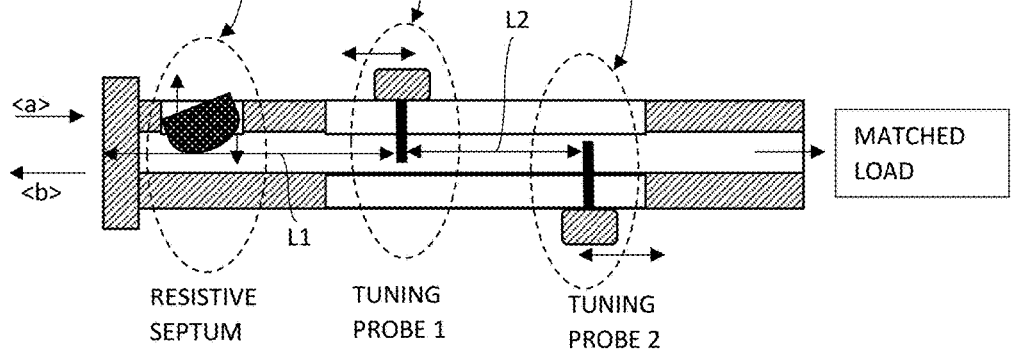

FIG. 6B shows the signal flow graph describing the tuner, which is also shown schematically in FIG. 6C: Each pair of nodes represents a port and each branch the complex signal flow s-parameter S11 or S21; each tuning probe (FIG. 6D) is described by a two-port having a reflection factor R (S11, S22) and a transmission factor T (S21, S12): probe 1 has R1 and T1, probe 2 has R2 and T2 and the resistive septum (FIG. 6A) has a small residual reflection R0 and a controlled attenuation T0. The injected signal <a> returns as <b> after traversing several simple and revolving loops. The simple loops describe direct reflections and the revolving loops the multiple reflections: loops 1, 2 and 5 are direct (simple) loops and loops 3, 4 and 6 are revolving loops. Direct loops contribute single vector components to the returning signal wave <b>. Revolving loops contribute an infinite series of rapidly vanishing signal wave vectors. The total sum is therefore converging. Between each probe there is a delay $\exp(-j\beta L)$; transmission lines are described by simple phase delays $\beta 1=2\pi L1/\lambda$ or $\beta 2=2\pi L2/\lambda$. Assuming the probes represent capacitors C=C1 and C=C2 (FIG. 6D) then we can approximate: $R1=-j\omega C1Zo/(2+j\omega C1Zo)$; $R2=-j\omega C2Zo/(2+j\omega C1Zo)$; $T1=2/(j\omega C1Zo)$ and $T2=2/(2+j\omega C2Zo)$. In the case of the resistive septum (FIG. 6A) we get: $R0=Zoj\omega C/(2R+Zo)j\omega C+2)$ and $T0=2(Rj\omega C+1)/(j\omega C(Zo+2R)+2))$; The section after probe 2 is 50Ω, therefore signal is not returning and the associated T2 is ignored. By generating the signal loops 1, 2, 3, . . . which contribute to the overall reflected signal <b> we obtain for the reflection factor at the test port:

$$S11=<b>/<a>\approx\{-R0-e^{-j2\beta L1}T0^2R1-e^{-j2\beta(L1+L2)}\\R2T1^2T0^2-e^{-j2\beta(L1+2L2)}T1^2T0^2R2^2\\R1-e^{2\beta(L1+2L2)}R2T1^2T0^2R0R1\ldots\};$$

the series of loops is truncated, since the loops 3, 4 and 6 are repeated n times with n=1,2,3,4 . . . towards infinite, but their contribution to the total reflection factor at the test port is rapidly decreasing, since all s-parameters R (reflection) and T (transmission) and their products appearing at higher power $T0^{2n}$, $T1^{4n}$, $R0^{2n}$, $R1^{2n}$, $R2^{4n}$ etc. are geometrically smaller than 1, forming this way a converging infinite sum. The transmission between the test port 70, probe 1, 73 and probe 2, 77 is described by lossless transmission lines having a phase $-2\pi L/\lambda$, where λ is the wavelength $\lambda=300$ mm/Frequency(GHz).

Figure 8:
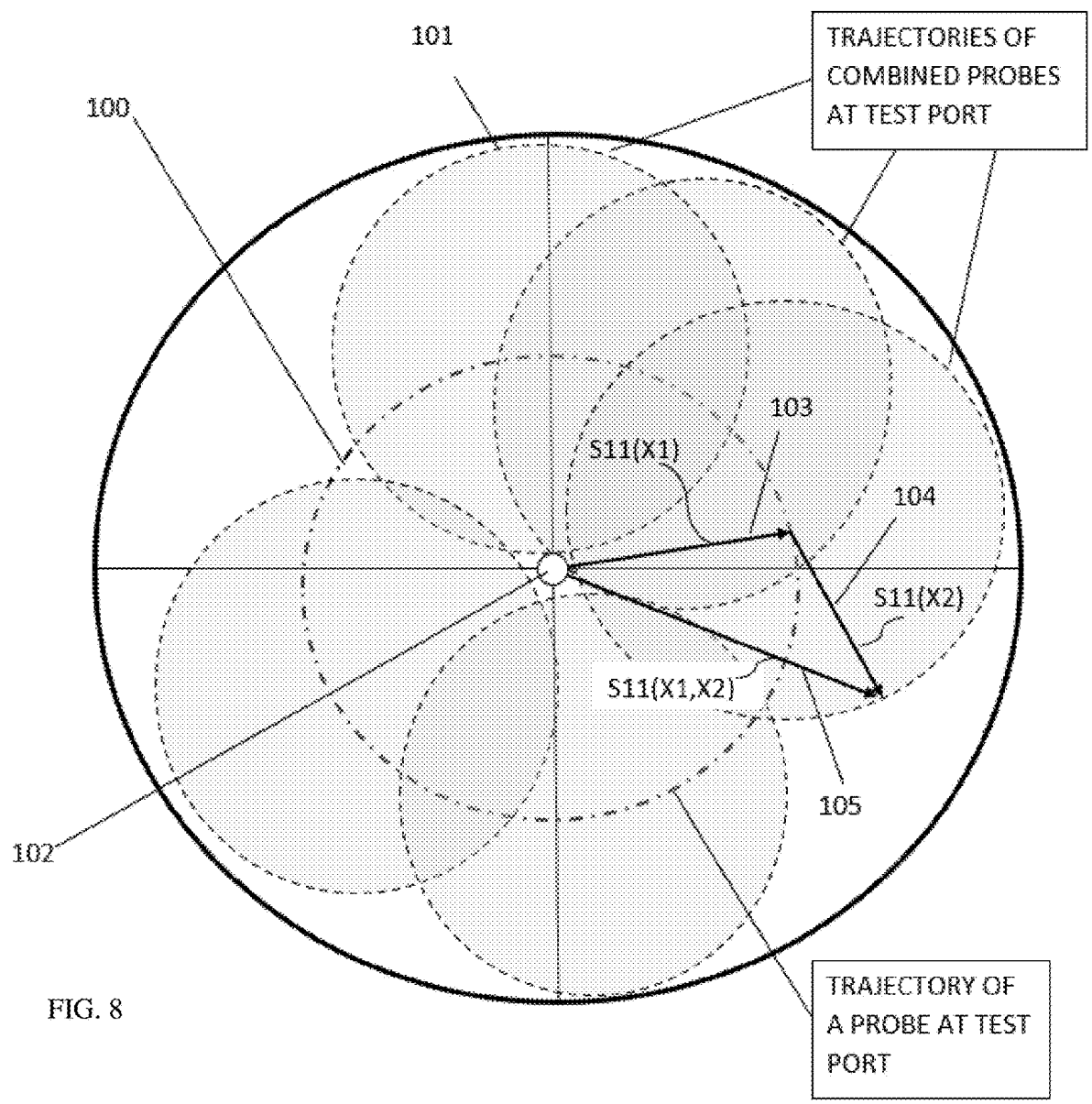
FIG. 8 depicts the Smith chart coverage mechanism using two-probe impedance tuner with fixed probe insertion depth with the resistive septum withdrawn.

Coverage of the Smith chart is shown in FIG. 8: Overall S11(X1,X2) 105 is created by vector sum of S11(X1) 103 and S11(X2) 104; the canter of the Smith chart 102 is reached when S11(X1) and S11(X2) are opposed and a maximum when they are in line (same phase). Movement X1 created a circle 100 and movement X2 an epicycloid trajectory 101.

Figure 9:
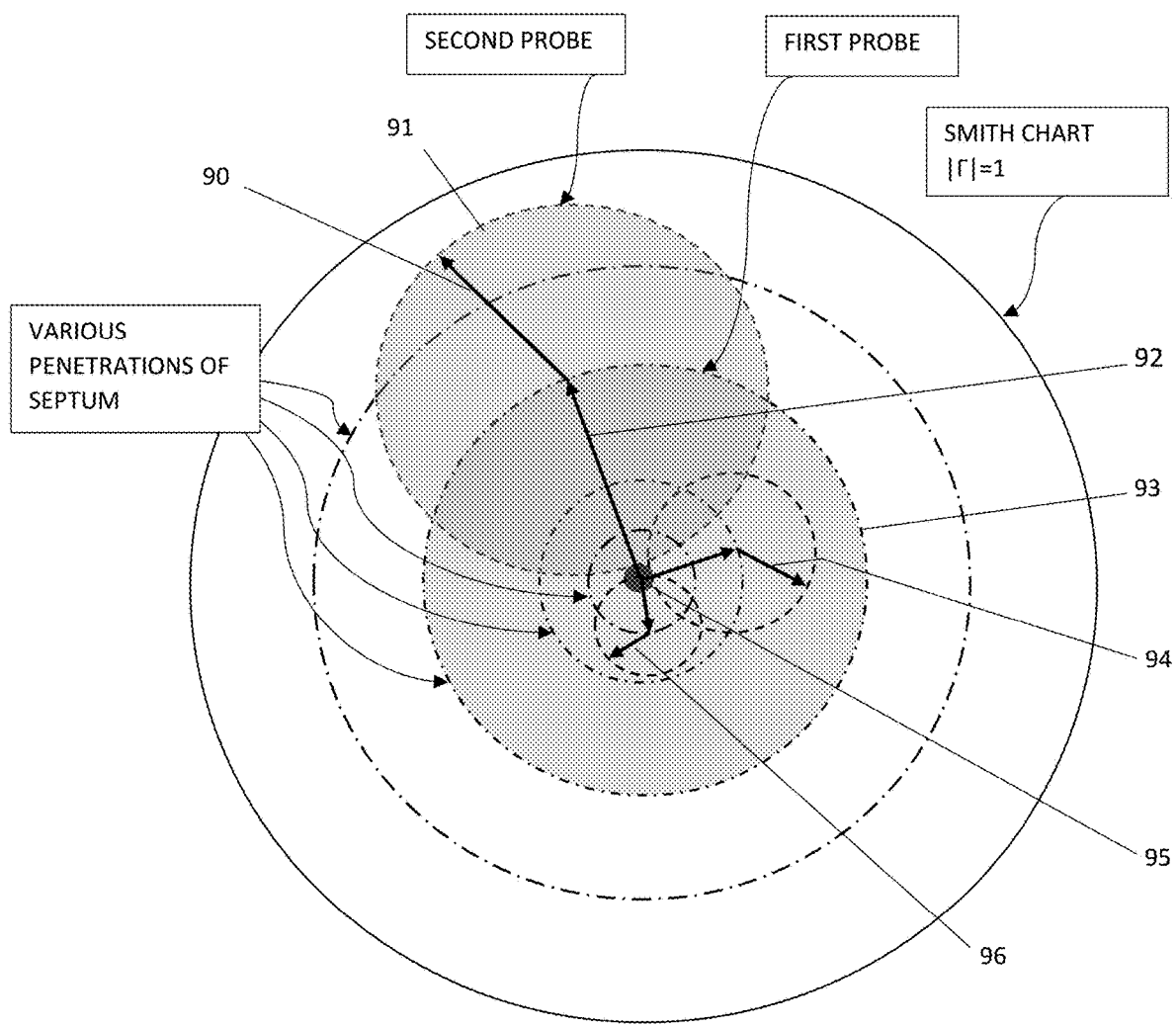
FIG. 9 depicts the Smith chart coverage, created using the two-probe impedance tuner with fixed probe insertion depth and a set of resistive septum insertions.

The effect of the attenuator 702 is shown in FIG. 9: at low septum penetration we observe vectors 90, 92 on trajectory 93 around the center 95 synthesizing trajectory 91; at medium septum penetration we observe vector 94 and at high penetration vector 96.

Figure 12:
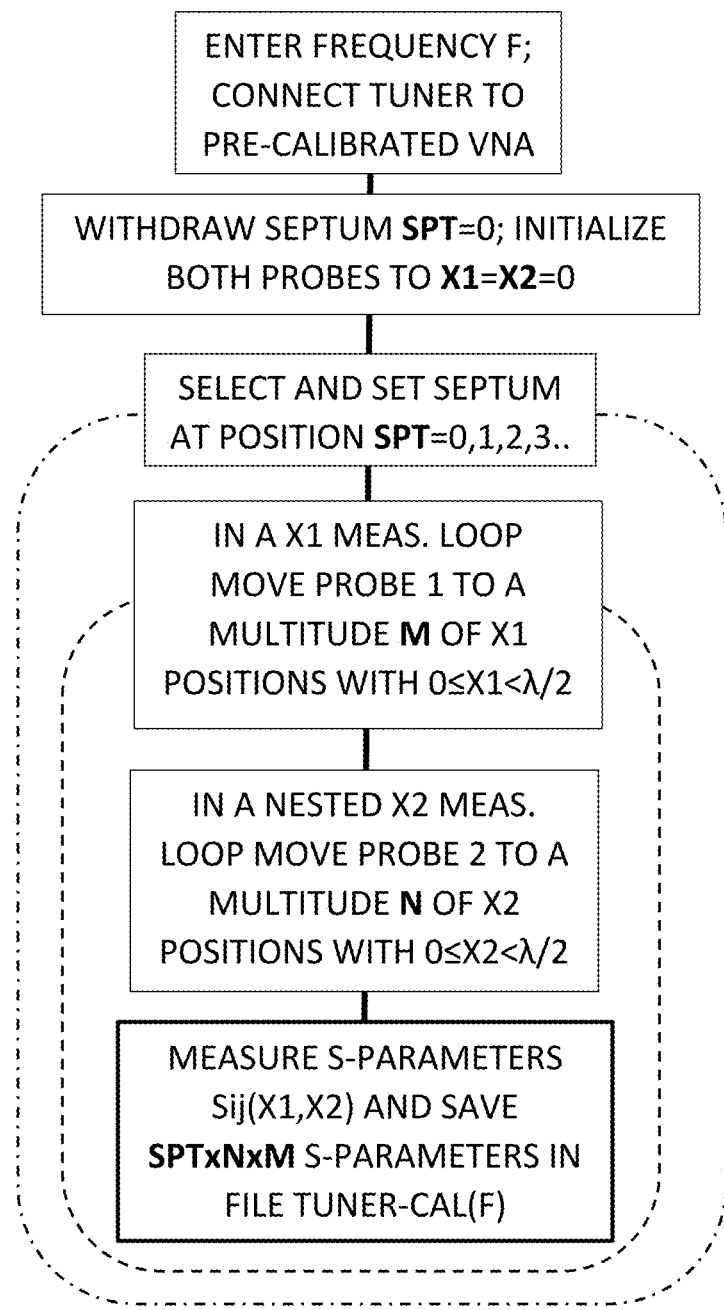
FIG. 12 depicts a ("brute force"=full permutation) calibration flowchart.

The tuner calibration process at a given frequency F has been reported before for single or multiple probe tuners with vertical probe control (see ref. 5); in the present case of horizontal only probe control, calibration is possible using a traditional method (FIG. 12) consisting in measuring, on a pre-calibrated vector network analyzer (VNA) s-parameters between the test 70 and idle 701 ports (FIG. 7) for a limited number of resistive septum settings SPT (FIG. 9): all N*M permutations of 1,2,3 . . . N times X1 and 1,2,3 . . . M times X2 tuning probe positions are measured with typical SPT settings of 2 or 3 and N~M values of at least 100, in order to generate a dense enough grid of calibrated points of no more than 3.6° angle between points on the Smith chart. In this case the total calibration of 10,000 points for one SPT setting will last an average of 2.5 hours (assuming 1 second per point, including probe movement, data collection and saving).

Figure 15:
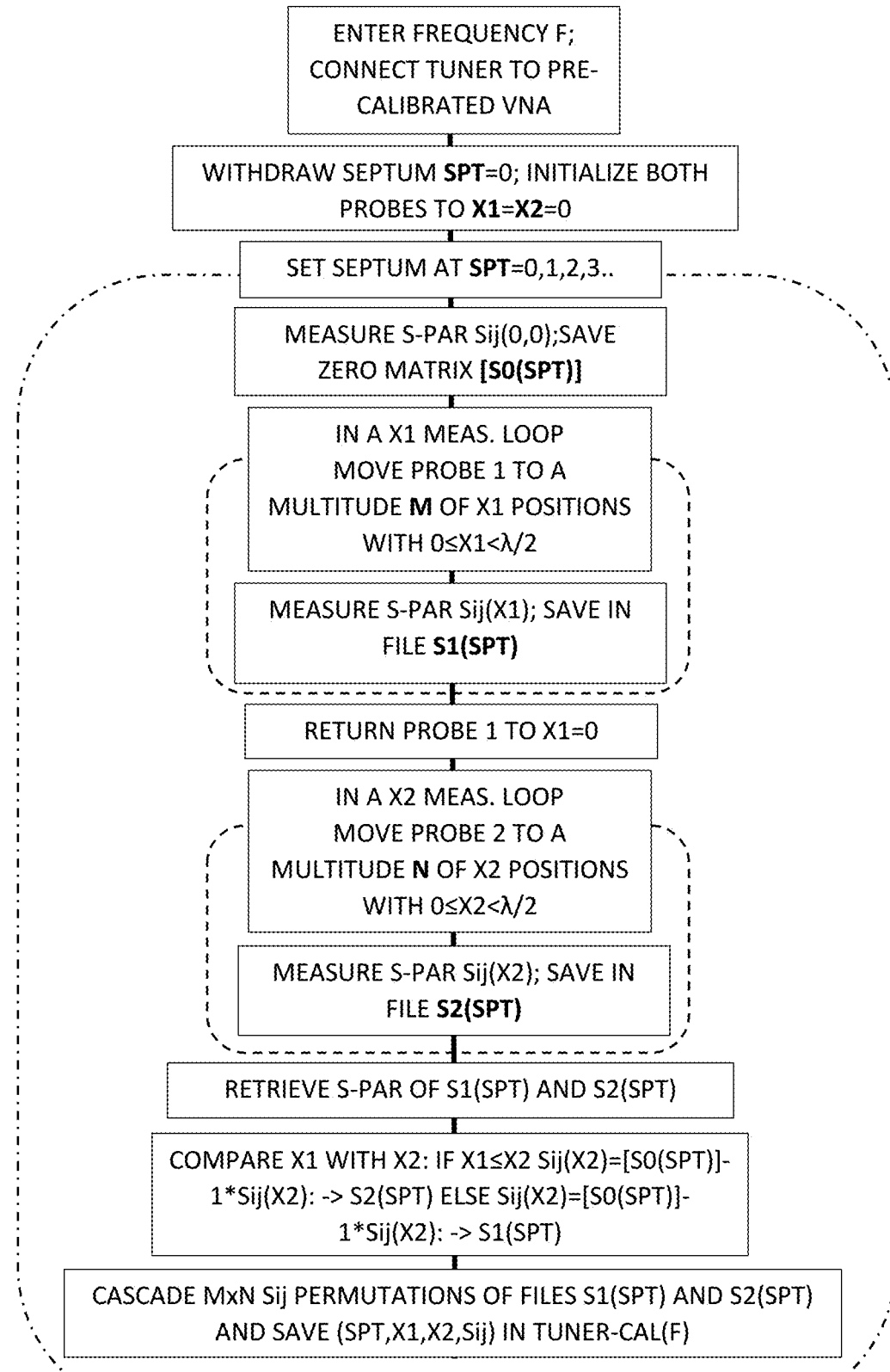
FIG. 15 depicts the flowchart of the fast de-embedding tuner calibration.

The preferred embodiment of a de-embedding calibration method of the actual tuning section after the resistive septum allows a much faster operation as follows (FIG. 15): measure first the s-parameters of the waveguide transmission line with both probes initialized (X1=X2=0) and the septum pre-set to one of the pre-selected states SPT (SPT=0 means septum is withdrawn, medium insertion, stronger insertion etc . . . ) and save in a zero matrix [S0(SPT)]; then move probe 1 to a multitude of M positions X1 and measure s-parameters Sij(X1) between the test and idle ports of the tuner and save the data in a file S1(SPT); then initialize probe 1 to X1=0, move probe 2 to a multitude N positions X2, measure s-parameters Sij(X2) and save in a file S2(SPT). Subsequently the data in files S1(SPT) and S2(SPT) are retrieved and saved in rapid access memory RAM of the system controller; since the probes may cross over each other, X1 can be equal, bigger or smaller than X2 and this decides on the sequence of de-embedding: if X1≤X2, then Sij(X2) is de-embedded, i.e., cascaded with $[S0(SPT)]^{-1}$ and re-saved in file S2(SPT); else, if X1>X2, then Sij(X1) is de-embedded, i.e., cascaded with $[S0(SPT)]^{-1}$ and re-saved in file S1(SPT); subsequently all M*N permutations of the s-parameters in updated files S1(SPT) and S2(SPT) saved in RAM, are cascaded into a new set of M*N s-parameter sets Sij(X1,X2) which are the calibration data of the tuner at frequency F for the given SPT: TUNER-CAL(F); the data in the tuner calibration file are sorted in SPT blocks, i.e., for each SPT value 0, 1, 2, 3 . . . there is a block of N*M Sij(X1,X2) data sets; presumably all s-parameter matrix cascading is executed after converting s-parameters to ABCD or transfer (T-parameters), and back to s-parameters; the result of this operation lasts much less than before: a total of M+N points per SPT setting are measured and data are processed very fast in memory. The total time for each septum setting (assuming 1 second per point, as before) is: 200*1 sec+20 sec (processing time)≈4 minutes, compared with approximately 2.5 hours, a significant gain.

Figure 10:
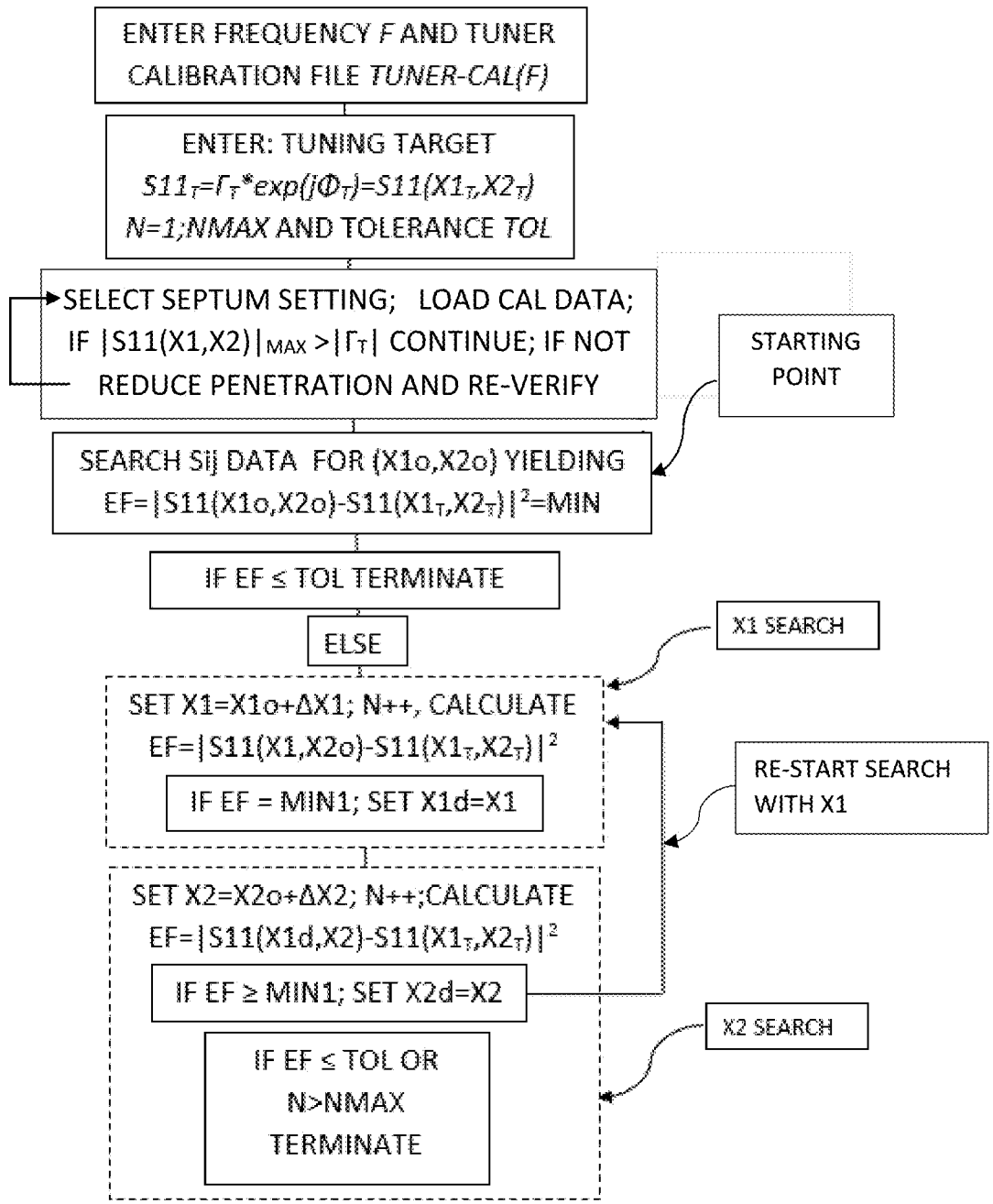
FIG. 10 depicts the impedance synthesis (tuning) flowchart.
Figure 11:
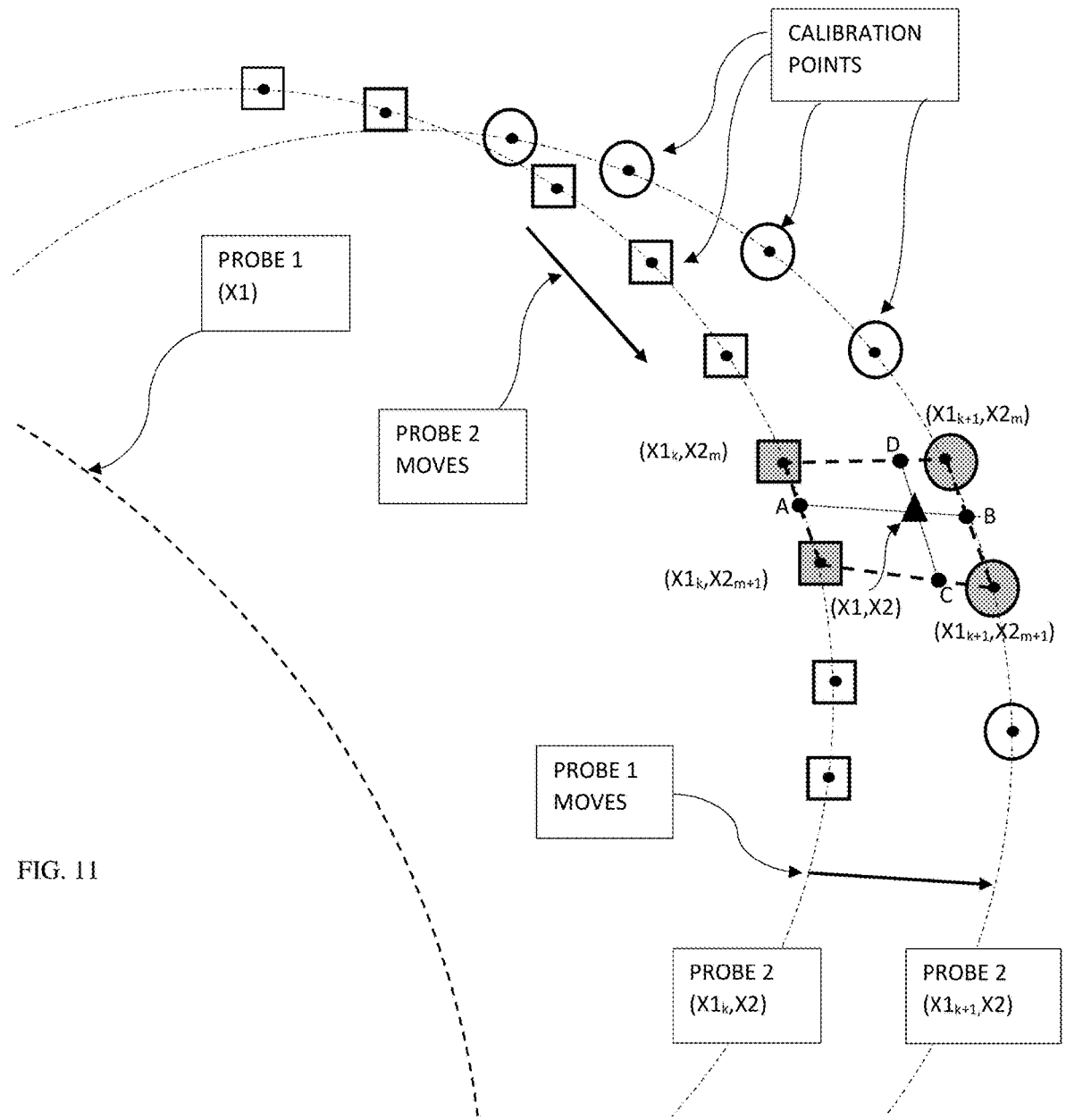
FIG. 11 depicts the interpolation technique.

In order to synthesize a large number of possible target impedances using a limited number of calibration data requires adequate interpolation routines, because the tuner has millions of possible states (depending on the frequency and step resolution of the carriage control, the probes can be set to 1000 or more distinct X1 and X2 positions or motor-steps, in which case we have 1 million or more distinct tunable impedances). The interpolation routine uses the points on the two trajectories shown in FIG. 11; the high number of interpolated points allows accurate determination of the s-parameters Sij(X1,X2) of the tuner for any arbitrary probe settings (X1,X2) of the tuning probes at the pre-selected SPT setting, based on the four closest calibration points $(X1_k, X2_m)$, $(X1_{k+1}, X2_{m+1})$, $(X1_{k+1}, X2_m)$ and $(X1_k, X2_{m+1})$, each pair selected on either the X1 or the X2 direction or trace of probe movement (FIG. 11); herein the probe positions are selected to be successive: $X1_k \leq X1 < X1_{k+1}$ (on the X1 trace) and $X2_m \leq X2 < X2_{m+1}$ (on the X2 trace), in order to create a polygon between the above calibrated points, that includes the tunable point with target coordinates (X1,X2); once these four points are determined, the interpolation executes in two steps: in step 1 linear interpolation allows determining s-parameters of four new interpolated points, marked in FIG. 10 as A, B, C, D: as follows:

$$Sij(A) = Sij(X1_k, X2_m) + (X2-X2_m)/(X2_{m+1}-X2_m) \cdot (Sij(X1_k, X2_{m+1}) - Sij(X1_k, X2_m));  \quad [eq. 1]$$

$$Sij(B) = Sij(X1_k, X2_m) + (X2-X2_m)/(X2_{m+1}-X2_m) \cdot (Sij(X1_{k+1}, X2_{m+1}) - Sij(X1_{k+1}, X2_m));  \quad [eq.2]$$

$$Sij(C) = Sij(X1_k, X2_{m+1}) + (X1-X1_k)/(X1_{k+1}-X1_k) \cdot (Sij(X1_{k+1}, X2_{m+1}) - Sij(X1_k, X2_{m+1}));  \quad [eq.3]$$

$$Sij(D) = Sij(X1_k, X2_m) + (X1-X1_k)/(X1_{k+1}-X1_k) \cdot (Sij(X1_{k+1}, X2_m) - Sij(X1_k, X2_m));  \quad [eq.4]$$

In step 2 then, a new linear interpolation generates Sij(X1, X2) using these four new first order interpolated points Sij(A), Sij(B), Sij(C) and Sij(D) as follows:

$$Sij(X1,X2) = \{Sij(A) + (X1-X1_k)/(X1_{k+1}-X1_k) \cdot (Sij(B) - Sij(A)) + Sij(C) + (X2-X2_{m+1})/(X2_m-X2_{m+1}) \cdot (Sij(C) - Sij(D))\}/2. \quad [eq.5]$$

Once the tuner is calibrated and the s-parameter data Sij(X1,X2) are saved in a calibration file TUNER-CAL(F) at a frequency F and a number of septum settings SPT, they can be used to synthesize, either manually or in an automatic measurement procedure, user-defined impedances or reflection factors; the tuning process executes in a number of steps (FIG. 10): in a first step, after the frequency, the number of allowable search iterations NMAX and the tuning tolerance TOL (the allowable vector difference between the target and the tuned reflection factor) are defined, the process starts with the highest SPT setting (deepest septum penetration=largest attenuation) and loads the data of the tuner calibration file in random access (fast) RAM memory. The data are imported from the associated calibration file TUNER-CAL(F) and are scanned for the maximum reflection factor |S11(X1,X2)| which is compared with the target reflection factor $|S11(X1_T, X2_T)|$: if the target vector is larger than the vector of the smallest maximum vector of the calibrated points, then the search returns by reducing the septum penetration (and the attenuation) to the next pre-selected SPT value and re-loads the data. The comparison repeats until a septum setting is determined, which allows the calibrated points to include the target point. Once this initial issue is settled the search starts by comparing the newly downloaded calibrated reflection factors S11(X1,X2) with each imported Γ and determines a set of starting values (X1o,X2o) for which the vector distance in form of an error function $EF = |S11(X1o, X2o) - \Gamma|^2$ is smallest (i.e., finding the smallest vector distance between the target Γ and the closest calibrated point) to be used in the subsequent search.

If this value EF is already smaller than the prescribed tuning tolerance TOL, the X1o,X2o values are saved, and the search terminates with X1.final=X1o and X2.final=X2o. Else, starting with X1o,X2o, the process modifies X1 and X2 alternatively by small amounts δX1 and δX2, which are proportional (in a regula falsi kind of algorithm) to the change of the error function EF, the new interpolated value S11(X1+δX1,X2+δX2) is calculated and EF re-calculated until a new local minimum of EF is reached. This means, if EF increases, then the δX1 or δX2 correction becomes negative and the X1 or X2 search reverses direction. After a first local minimum of EF, the search changes direction, conserves the actual X1 value and changes X2 as before; each time the EF function traverses a local minimum the search switches from X1 to X2 and back. After a number of iterations the vector (X1,X2) converges to final values X1.final and X2.final, either because EF is smaller that the tuning tolerance or the search is truncated, because the previously defined maximum number of iterations NMAX is exceeded. The search may end up in a local minimum with EF larger than the tuning tolerance, though in the case of only two variables a local minimum is improbable; any residual difference would be related to the density of calibrated points or the size of the tuning tolerance (which cannot be zero, since the stepping motor control of the tuning probes dictates that the tuner, even with at very high positioning resolution, because of the use of stepper motors, remains digital). To be able to execute this procedure, requires the accurate interpolation routines described above, i.e., mathematical relations that allow calculating s-parameters Sij of the tuner at arbitrary probe positions (X1,X2) different than the calibrated positions. For best accuracy these relations must describe approximately enough the natural behavior of the tuner as shown in (FIG. 9).

Obvious alternative embodiments of fixed penetration tuning probes, diametrically inserted into and sharing the same slabline of waveguide slide screw impedance tuners and associated calibration and tuning methods shall not impede on the core idea of the present invention.

What is claimed is:

1. A load pull waveguide tuner comprising:
   a1) a waveguide transmission line with two broad walls, a top broad wall, and a bottom broad wall, and two narrow side walls, a test port, and an idle port, three slots, a first, a second and a third slot, parallel to a longitudinal axis of the waveguide transmission line, and two tuning probes, probe P#1 and probe P#2 having a thickness; wherein
   the first slot is centered on one of the two broad walls and placed between the test port and the second and third slots, the second and third slots are placed one on the top and one on the bottom broad wall, symmetrically off a center line of the waveguide transmission line by at least half the thickness of the tuning probes;
   a2) two remotely controlled mobile carriages C#1 and C#2, mounted one on the top and one on the bottom broad wall and moving along the waveguide transmission line; the carriage C#1 holding the tuning probe P#1 and the carriage C#2 holding the tuning probe P#2, which said probes are inserted from opposite sides, at a fixed penetration, tuning probe P#1 into the second slot and tuning probe P#2 into the third slot, and a3) a tapered resistive attenuation septum remotely insertable into the first slot; and wherein the carriage C#1 moves the probe P#1 to a position X1 relative to the test port, and the carriage C#2 moves the probe P#2 to a position X2 relative to the test port.

2. The load pull tuner of claim 1, wherein
the second and third slots of the waveguide transmission line are at least one half of a wavelength long ($\lambda/2$) at a minimum operation frequency (Fmin) of the load pull tuner.

3. A tuner calibration method of the load-pull tuner of claim 2, comprising the following steps:
connect the load-pull tuner to a vector network analyzer (VNA), pre-calibrated at a frequency F;
define two or more insertion settings (SPT)=0, 1, 2, . . . of the resistive septum;
withdraw the resistive septum from the waveguide transmission line to SPT=0;
in a succession of septum and tuning probe setting and measurement loops proceed as follows:
in a septum setting and measurement loop:
(a) set the septum to a position SPT=0,1,2 . . . :
move the tuning probes to X1=X1.0 and X2=X2.0 relative to the test port (initialize);
in a set of nested loops:
(b) in a first nested measurement loop for a multitude M>1 of positions X1, with X1.0≤X1≤X1.0+$\lambda$(F)/2:
move tuning probe P#1 to position X1, in a second nested measurement loop, inside the first nested loop, for a multitude N>1 of positions X2 with X2.0≤X2≤X2.0+$\lambda$(F)/2,
move tuning probe P#2 to position X2;
measure s-parameters Sij, whereby {i,j}={1,2};
save (SPT, X1, X2, Sij(SPT,X1,X2)) in a file TUNER-CAL(F);
resume to the next step of the first nested loop (b);
when the first nested loop (b) terminates, resume with the septum setting loop (a);
when the septum setting loop (a) terminates, save the file TUNER-CAL(F) and terminate.

4. A tuner calibration method of the load-pull tuner of claim 2, comprising the following steps:
connect the load-pull tuner to a vector network analyzer (VNA), pre-calibrated at a frequency F;
define two or more insertion settings SPT=0, 1, 2, . . . of the resistive septum;
withdraw the resistive septum from the waveguide transmission line to SPT=0;
move the tuning probes to positions X1=X1.0, X2=X2.0 relative to the test port (initialize);
in a septum setting and measurement loop:
set the septum to a position SPT=0,1,2 . . . :
measure s-parameters of the load-pull tuner and save in zero matrices [S0(SPT)];
in a succession of septum and tuning probe settings and measurement loops proceed as follows:
in an overall septum SPT loop:
set the septum to a position SPT=0,1,2 . . . ;
in a first nested measurement loop, set probe P#1 to a multitude M>1 of positions X1, with X1.0≤X1<X1.0+$\lambda$/2, measure s-parameters Sij(X1,X2.0), with {i,j}={1,2} and save in a file S1(SPT);
return probe P#1 to the position X1=X1.0 (initialize);
in a second nested measurement loop, set probe P#2 to a multitude N>1 of probe P#2 positions X2, with X2.0≤X2<X2.0+$\lambda$/2, measure s-parameters Sij(X1.0,X2), with {i,j}={1,2} and save in a file S2(SPT);
retrieve the s-parameters of the files S1(SPT) and S2(SPT);
scan the retrieved s-parameters and compare X1 with X2:
if X1≤X2 cascade (convert s-parameters to transfer parameters, multiply and convert back to s-parameters) the s-parameters Sij(X1.0,X2) with [S0(SPT)]$^{-1}$ and replace in the file S2(SPT),
else if X1>X2 cascade the s-parameters Sij(X1,X2.0) with [S0(SPT)]$^{-1}$ and replace in file S1(SPT);
retrieve the s-parameters from the updated files S1(SPT) and S2(SPT), cascade the s-parameters of all permutations N*M in computer memory and save (SPT,X1,X2,Sij(SPT,X1,X2)) in file TUNER-CAL(F);
continue with the overall SPT loop.

5. An interpolation method of the load pull tuner as in claim 2 comprising:
a) retrieve septum setting SPT, tuning probe positions X1 and X2 and s-parameters Sij(SPT, X1,X2) of the calibrated points from a tuner calibration file comprising all setting permutations of the septum SPT and the two tuner probes X1 and X2 of the tuner and the associated s-parameters;
b) define a target point (X1.t,X2.t);
c) identify, using a numeric search, two pairs of successive calibration point coordinates, one pair of probe P#1 setting X1 and one pair of probe P#2 setting X2, closest to the target point (X1.t,X2.t);
d) execute a first set of linear interpolations of s-parameters Sij, one interpolation in X1 settings and one interpolation in X2 settings between the four closest calibration points, yielding s-parameters Sij at four new points A,B in X1 setting and C,D in X2 setting;
e) calculate Sij parameters at target point (X1.t,X2.t) as an average of a second set of linear interpolations one between the points A and B and one between the points C and D.

6. An impedance synthesis (tuning) method of the load-pull tuner of claim 2 comprising:
a) define a frequency F and an associated tuner calibration file;
b) define a tuning target, in form of a reflection factor $\Gamma=|\Gamma|*\exp(j\Phi)$, and a maximum number of iterations NMAX;
c) select a highest penetration setting SPT of the resistive septum;
d) download s-parameters Sij(SPT,X1,X2) from the tuner calibration file for the selected septum penetration setting SPT;
e) search for a maximum reflection factor |S11(SPT,X1,X2)| in the downloaded s-parameter Sij(SPT,X1,X2) data;
f) if the maximum reflection factor |S11(SPT,X1,X2)| is smaller than the target reflection factor |$\Gamma$|, reduce the penetration setting SPT of the septum and go to step (d);
g) search for a calibration point S11(SPT,X1o,X2o), for which an error function EF, defined as the square of the absolute vector difference between $\Gamma$ and the reflection factor S11(SPT,X1o,X2o) at the setting SPT of the septum and the tuning probe positions X1o and X2o (EF=|S11(SPT,X1o,X2o)–$\Gamma$|$^2$) is minimum;

h) set N=1 and search interpolated s-parameter data S11(SPT,X1,X2) in the area (X1,X2) surrounding the tuner setting (SPT,X1o,X2o) for a final setting (SPT, X1.final,X2.final) as follows:
  h1) from the tuner setting (SPT,X1o,X2o) in a X1 iteration loop:
    set N=N+1 and change the probe setting X1o by a small amount δX1 to X1o+δX1, whereby δX1 is proportional to the change of the Error Function EF=|S11(SPT,X1o+δX1,X2o)−Γ|$^2$), until the error function EF reaches a minimum, and define X1o'=X1o+δX1;
  h2) from a new tuner setting (SPT,X1o',X2o) in a X2 iteration loop:
    set N=N+1 and change the probe setting X2o by a small amount δX2 to X2o+δX2, with δX2 proportional to the change of the Error Function EF=|S11(SPT,X1o',X2o+δX2)−Γ|$^2$, until the error function EF reaches a minimum, and define a new probe position X2o'=X2o+δX2;
  h3) set probe positions X1o=X1o', X2o=X2o' and repeat steps h1) and h2) until there is no further reduction of the error function EF, or if the number N of iterations exceeds the maximum number of iterations NMAX;
  h4) define probe positions X1.final=X1o' and X2.final=X2o';
i) move the tuning probe P#1 to position X1.final and the tuning probe P#2 to position X2.final.

\* \* \* \* \*